(12) United States Patent
Wang et al.

(10) Patent No.: US 8,125,291 B2
(45) Date of Patent: Feb. 28, 2012

(54) ELECTROMAGNETIC INTERFERENCE NOISE SEPARATOR

(75) Inventors: Shuo Wang, Blacksburg, VA (US); Fred C. Lee, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 372 days.

(21) Appl. No.: 12/548,030

(22) Filed: Aug. 26, 2009

(65) Prior Publication Data

US 2011/0050358 A1 Mar. 3, 2011

(51) Int. Cl.
*H03H 7/38* (2006.01)

(52) U.S. Cl. ............. 333/32; 333/181; 333/177; 333/12

(58) Field of Classification Search ............. 333/32, 333/181, 185, 12, 177, 178
See application file for complete search history.

(56) References Cited

U.S. PATENT DOCUMENTS 7,602,159 B2 * 10/2009 Wang et al. .................. 323/262
2011/0037444 A1 * 2/2011 Wildash ........................ 323/210
* cited by examiner

*Primary Examiner* — Stephen Jones
(74) *Attorney, Agent, or Firm* — Whitham Curtis Christofferson & Cook, PC

(57) ABSTRACT

Improved performance of a noise separator circuit capable of separating common mode (CM) and differential mode (DM) components of electromagnetic interference (EMI) noise are provided by arrangement of terminating impedances such that the circuit is fully symmetric with respect of a pair of input ports. The noise separator circuit is further improved by perfecting features for canceling effects of parasitic inductances and capacitances, parasitic capacitance and inductance between circuit connections such as printed circuit board traces, minimizing leakage inductance effects of pairs of coupled inductors and mutual inductance effects between pairs of coupled inductors, providing sufficient magnetizing inductance for low frequency response, and preventing saturation of inductors using switched attenuators, providing a plurality of ground planes, choices of terminating resistors and circuit layout.

23 Claims, 10 Drawing Sheets

ELECTROMAGNETIC INTERFERENCE NOISE SEPARATOR

FIELD OF THE INVENTION

The present invention generally relates to measurement of common mode (CM) and differential mode (DM) noise components present in conducted electromagnetic interference (EMI) noise which may be presented at the power input to an electrical or electronic device and, more particularly, to a device for accurately separating CM and DM noise components over a wide frequency band for conducted EMI diagnosis and power transformer and filter circuit design.

BACKGROUND OF THE INVENTION

Many electrical and electronic devices are designed and constructed to operate from power at a substantially constant voltage and include a power supply to convert power from an alternating current or battery input to the required nominal voltage. However, to achieve high efficiency of such power conversion, power supplies employ switching circuits which control frequency and/or duty cycle of current pulses drawn from a power source to achieve the desired voltage with good regulation and thus inherently generate electromagnetic interference (EMI) noise at the input from the power source. EMI noise may also be generated by fluctuations in the amount on power drawn by the electrical or electronic device such as the large current swings that may be produced by a data processing or logic array circuit as switching is performed in a highly parallel and clocked fashion between periods in a stand-by state during which comparatively little power is drawn. This EMI noise reflected to the power input is referred to as conducted EMI noise or, simply, conducted EMI since it is conducted back to the power source.

Conducted EMI noise has detrimental effects on operation of electrical and electronic products, particularly due to the high frequencies present therein which can cause heating in batteries or cause fluctuations in power delivered to other devices over commercial power distribution networks which may cause improper or unintended operation thereof. Accordingly, the Federal Communications Commission (FCC) issues EMI standards for almost all electronic products that may be connected either directly or indirectly to power grids and which specify the maximum conducted EMI noise level that can be produced in a wide frequency band from 10 KHz to 30 MHZ. To meet these standards, most electronic products use EMI suppression circuits such as filters to attenuate the EMI noise allowed to reach the power source. However, EMI noise is the vector sum of common mode (CM) and differential mode (DM) noise components which are not easily separated and which are often addressed in different ways in design of a filter to reduce them. EMI noise is conventionally measured using a spectrum analyzer and a pair of line impedance stabilization networks (one in each side of the power connection) which has no capability of separation of CM and DM noise components or even determining which component is dominant. Thus, EMI suppression circuit design as well as power supply circuit design has, in the past, been largely a matter of trial and error since CM and DM noise may be generated by different mechanisms and may require different approaches to EMI suppression.

Some circuits for noise separation have been proposed but none can accurately separate CM and DM noise components. Further, proposed circuits all include parasitic capacitances and inductances which, at high frequencies, necessarily degrade any degree of noise separation that any particular noise separator circuit proposed to date can achieve.

SUMMARY OF THE INVENTION

It is therefore an object of the present invention to provide a noise separator circuit which can accurately separate CM and DM components of EMI noise so that each component may be measured and evaluated by a spectrum analyzer.

In order to accomplish these and other objects of the invention, a circuit for separating common mode (CM) and differential mode (DM) components of conducted electromagnetic interference (EMI) noise is provided comprising a pair of input ports, a pair of coupled inductors, each coupled inductor having one terminal connected to a respective port and coupled to subtractively superimpose currents therein whereby a second terminal of one of the pair of coupled conductors outputs a fraction of differential mode noise, a pair of series-connected coupled inductors, each inductor having one terminal connected to a respective input port and coupled to additively superimpose currents therein whereby a fraction of common mode noise is output from a node serially connecting the pair of series connected coupled inductors, and impedance matching resistors connected such that the circuit is symmetrical with respect to respective input ports.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
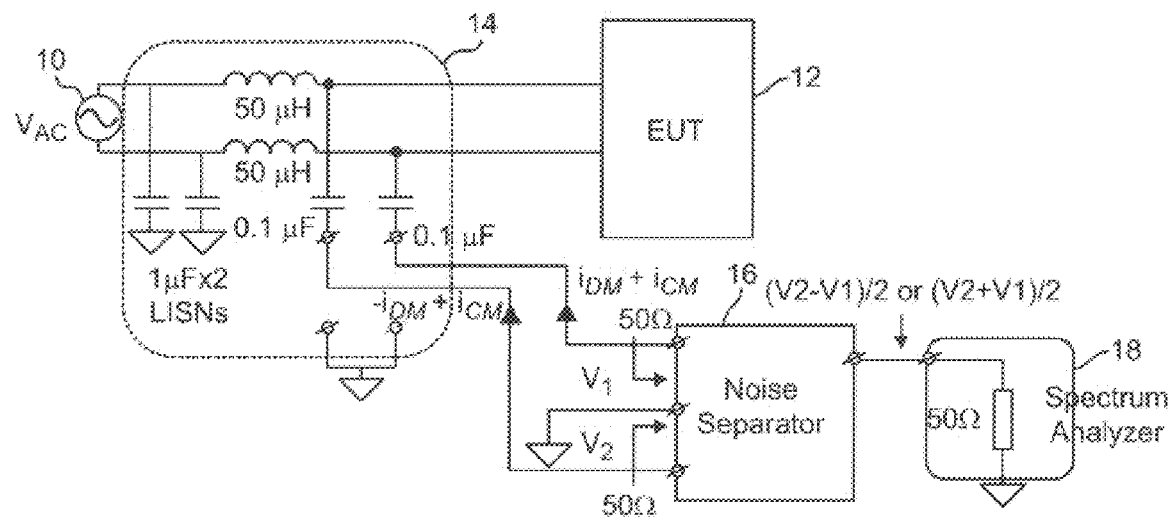
FIG. 1 is a schematic diagram for a generalized arrangement for measurement of CM or DM EMI noise components.

Referring now to the drawings, and more particularly to FIG. 1, there is shown a generalized test arrangement for measurement of CM or DM noise to which the invention is applicable. Since FIG. 1 is arranged to facilitate an understanding of the nature of the problem addressed by the invention and depicts inclusion of an ideal noise separator circuit which the invention closely approaches by virtue of being symmetrical and embodied using particular design techniques as will be discussed below in connection with FIGS. 11-18, no portion of FIG. 1 is admitted to be prior art in regard to the present invention.

FIG. 1 shows a generalized power source 10 as, for purposes of discussion, an alternating current (AC) power source since conducted EMI noise is principally regulated to limit noise levels coupled to a power distribution grid. However, it is to be understood that the power source could be a battery or other source delivering power as direct current (DC) at a nominally constant voltage. Power source 10 is connected to generalized electronics under test (EUT) through a pair of line impedance stabilization networks (LISNs) 14 in both sides of the power connection. Values chosen for the inductors and capacitors in the respective LISNs are chosen to present a 50 ohm impedance over a wide bandwidth and thus develop voltages V1, V2 which represent the total noise which is also the vector sum of the CM and DM noise components and are proportional to the EMI noise currents passing through the respective LISNs over a wide frequency range band. These voltages are then applied as separate inputs to a generalized noise separator circuit 16 that halves the instantaneous sum or difference of voltages V1 and V2, the absolute value of which would thus theoretically would correspond to the CM or DM component, respectively, of the EMI noise since CM and DM noise components are distinguished by the relative direction of current in the two respective power connections. That is, the CM component corresponds to equal currents in the same direction in the power supply connections while the DM component corresponds to equal currents in opposite directions in the power connections. The CM or DM component can then be input to a spectrum analyzer to determine the level and power of the noise over the range of frequencies of interest.

In order to accurately and correctly separate the CM and DM components, a noise separator should satisfy three basic requirements: first, the input impedances should be 50 Ohms at any frequency of interest to correspond to the impedance of the LISNs to guarantee consistent measurement conditions and accurate sampling of V1 and V2; second, the output should be (V1−V2)/2 for the DM component and (V1−V2)/2 for the CM component to guarantee accurate separation and achieve a transmission ratio of the CM or DM component (e.g. CMTR or DMTR) of 0 db; and third, leakage between CM and DM components should be very small to guarantee that interference between CM and DM components is as small as possible and that the CM and DM rejection ratios (e.g. CMRR and DMRR) are very high. Most known or proposed noise separators cannot satisfy all three requirements and thus results derived therefrom are highly questionable. For example, input impedance of known or proposed noise separators are noise source dependent (e.g. the input impedances are functions of input voltages or source impedances). Other known or proposed noise separators do not provide an output which is accurately one-half of the sum or difference of V1 and V2. Many known or proposed noise separators also exhibit a frequency dependent level of interference between CM and DM noise components.

A noise separator circuit in accordance with the invention and which substantially satisfies all of the three requirements noted above is disclosed in "Characterization, Evaluation, and Design of Noise Separator for Conducted EMI Noise Diagnosis" by S. Wang, F. Lee and W Odendal published in IEEE Transactions on Power Electronics: Vol. 20, No. 4: July 2003, which is hereby fully incorporated by reference and schematically illustrated in FIG. 2. As will be appreciated by those skilled in the art, the circuit of FIG. 2 principally comprises two branches which are respectively formed of coupled inductors in which one pair of inductors is series connected and the respective inductors of each pair are connected to the separate V1 and V2 inputs, port 1 and port 2, respectively. The inductors in the respective branches are magnetically coupled such that the voltage appearing at the other terminal of a respective inductor in each branch (e.g. the node serially connecting the serially connected pair of oppositely coupled inductors and forming port 3 or the second terminal of one of the similarly (but not series connected) coupled inductors of the other pair of coupled inductors forming port 4) is an additive or subtractive superposition of V1 and V2. Outputs to respective spectrum analyzers having 50 Ohm input impedances forming ports 3 and 4 of the noise separator circuit in accordance with the invention are appropriately terminated with impedance matching 50 Ohm resistors.

Figure 2:
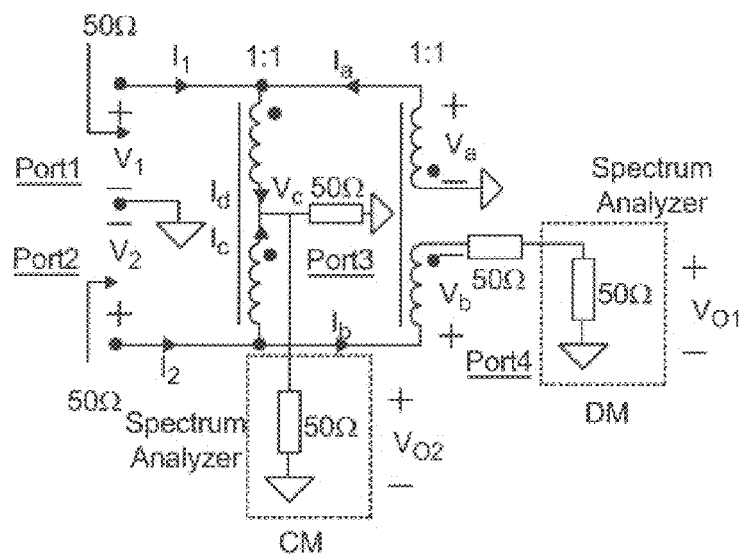
FIG. 2 is a schematic diagram of a known noise separator having acceptable but not optimal performance.
Figure 6:
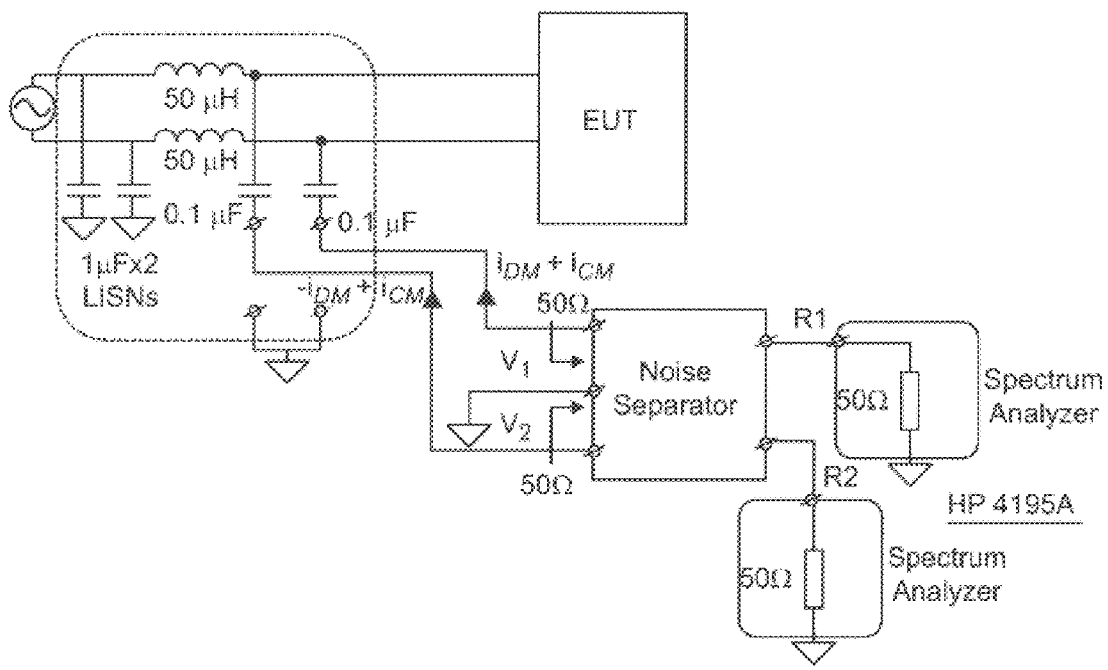
FIG. 6 is a schematic diagram of a test arrangement including the invention.

The circuit shown in FIG. 2 thus has advantages that input impedance are always a real 50 Ohms and independent of source impedances, the respective outputs on port 3 and port 4 are substantially exact DM and CM noise voltages, DM and CM can be measured concurrently using the same noise signal input as illustrated in the arrangement of FIG. 6 and using the same circuit, eliminating several possible sources of measurement error, DMRR and CMRR are very good and cost is very low since the circuit is very simple and comprises very few components.

Figure 3:
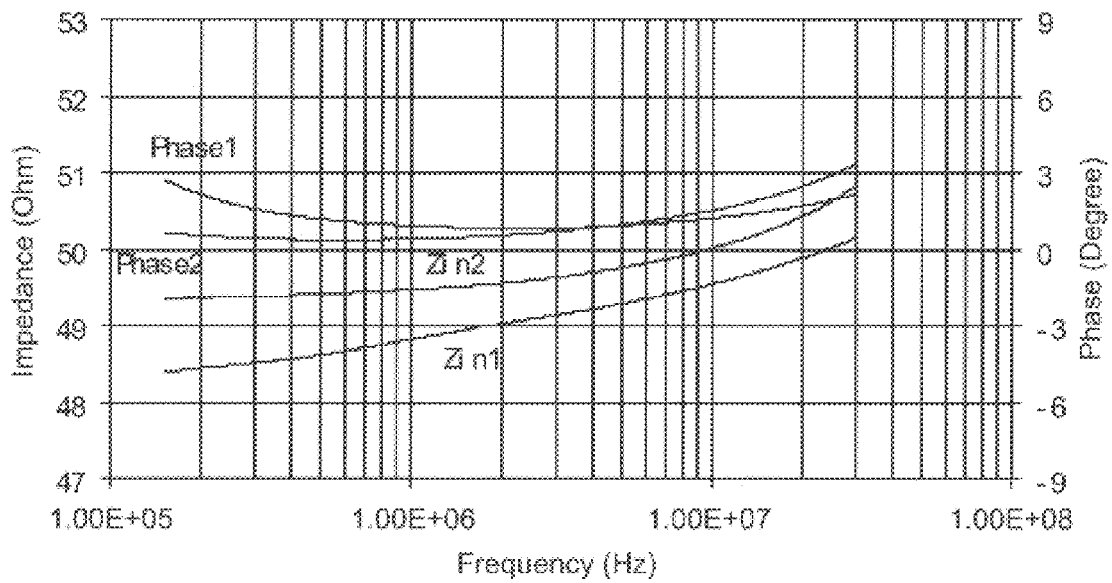
FIGS. 3, 4 and 5 are graphical representation of performance of the circuit of FIG. 2.
Figure 4:
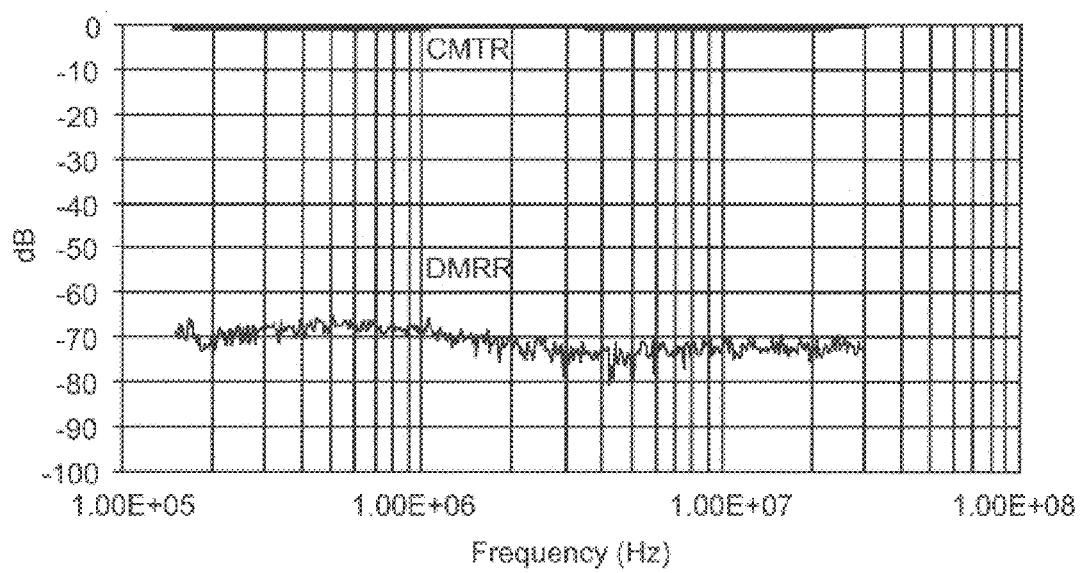
Figure 5:
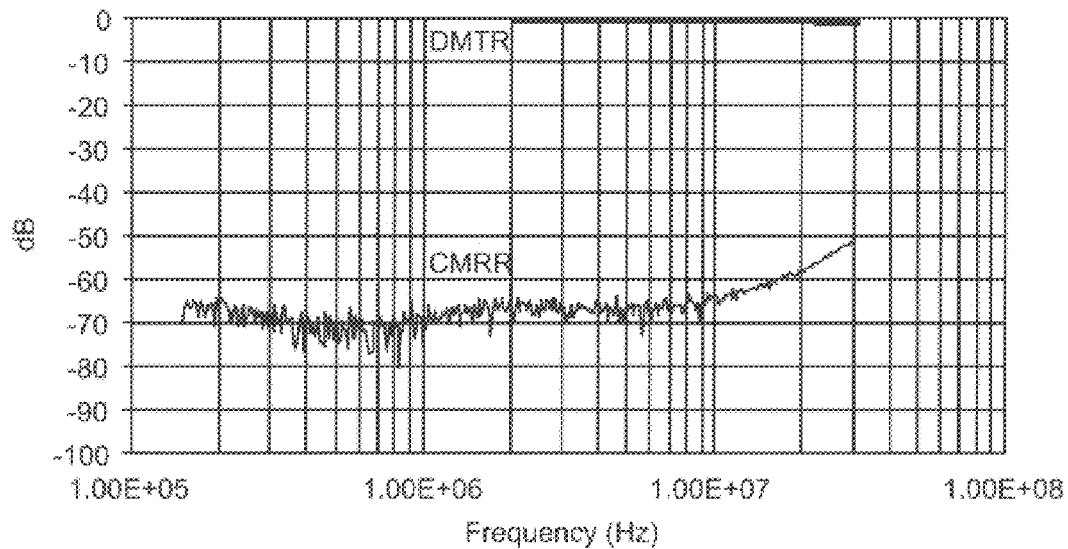
Figure 7:
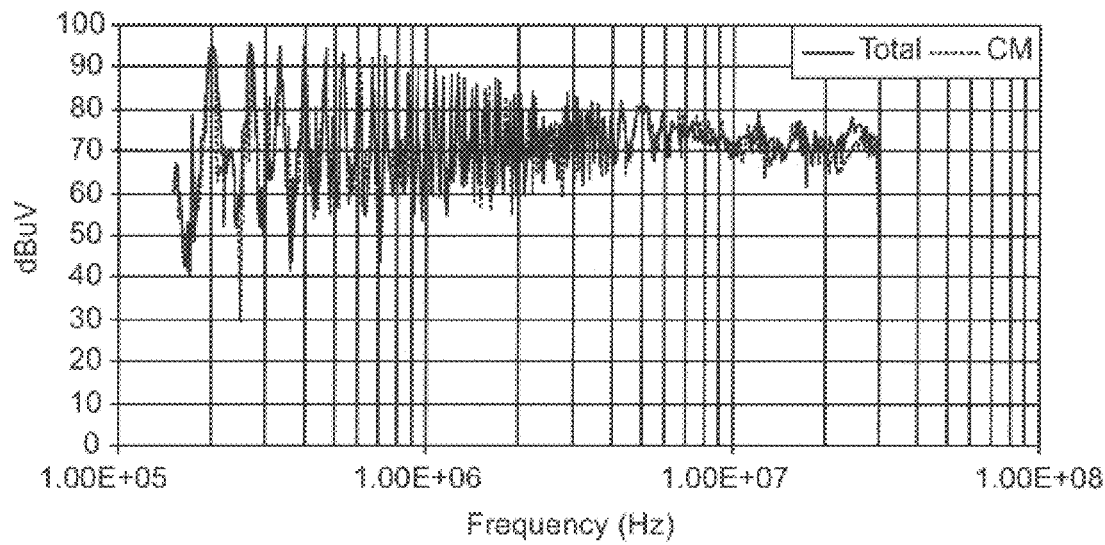
FIGS. 7 and 8 are graphs of total noise and CM or DM noise components thereof, respectively obtained using the test arrangement of FIG. 6.
Figure 8:
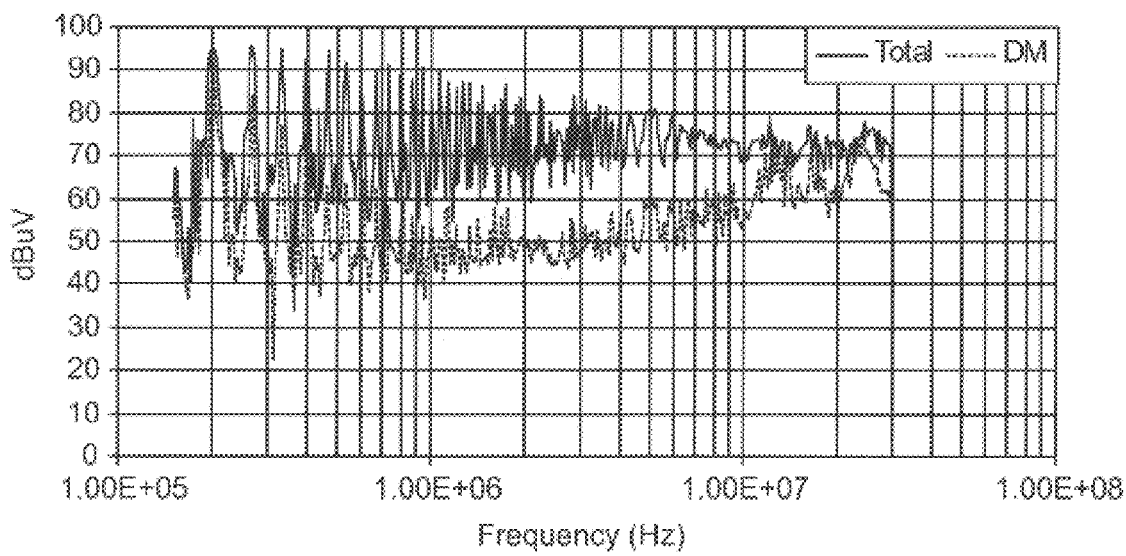

As illustrated in FIG. 3, over the frequency range of interest, impedance of a prototype in accordance with the circuit of FIG. 1 only varies from 48.4 Ω to 50.8 Ω and phase only varies from 0.38° to 3.3°. Thus input impedance is very close to a real 50 Ohm pure resistive impedance. A comparison of DMRR and DMTR in FIG. 4 and CMRR and CMTR in FIG. 5 shows highly accurate CM and DM output with excellent CMRR and DMRR. FIGS. 7 and 8 demonstrate that the noise separator successfully separates the CM and DM components of the total noise. Total noise is the same in both FIGS. 7 and 8 while it is evident in this particular test that CM and DM noise components are very different and that CM noise is dominant. Therefore, it is clearly seen from the experimental results that the noise separator of FIG. 2 in accordance with its most basic principles can substantially separate CM and DM noise components of EMI noise and thus can be a powerful tool is diagnosing sources of EMI noise for refinement of power supply design and for indicating proper approaches to EMI filter designs.

Figure 9:
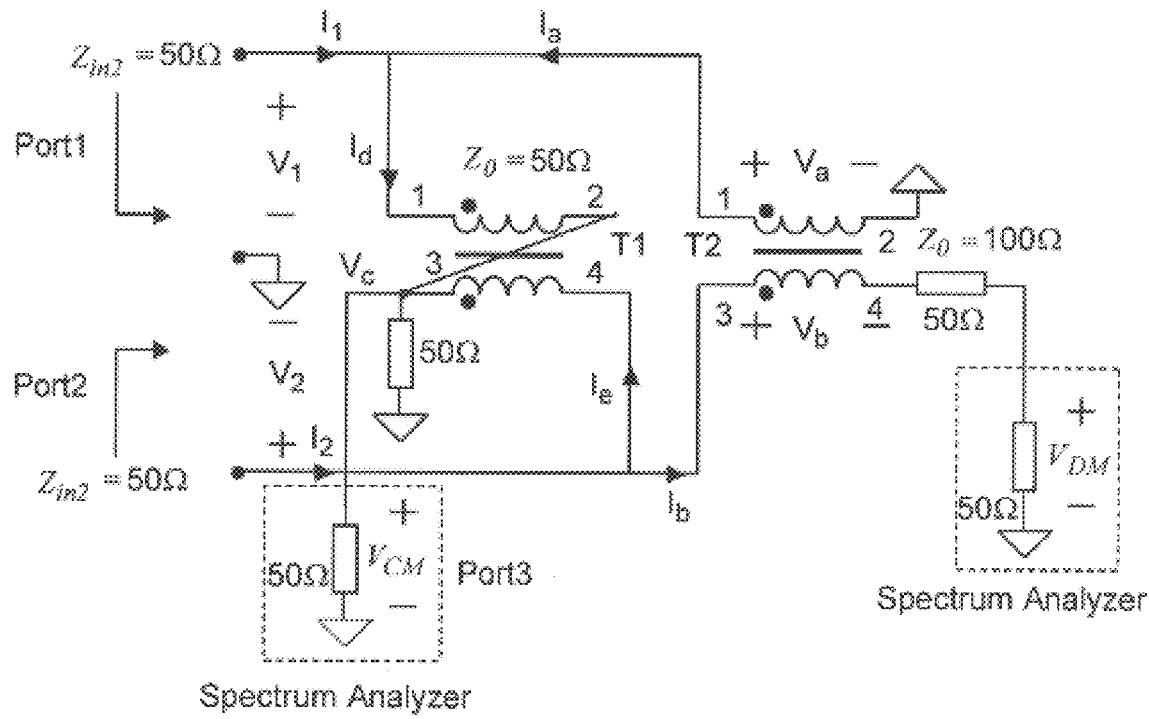
FIG. 9 is a schematic diagram of the known noise separator circuit of FIG. 2 that performs well to separate CM and DM noise components.

The circuit of FIG. 2 is redrawn in FIG. 9 with the inductors drawn as transformers T1 and T2 and to emphasize that the circuit of FIG. 2 is not entirely symmetrical. That is, the magnetizing impedance of T2 is not infinitely larger than the 100 Ohm impedance of the two series connected 50 Ohm resistances on the output loop of port 4 so that there is a small difference of the two input impedances. Therefore, the input impedances at port 1 and port 2 are not necessarily identical although they are shown to be very similar in FIG. 3 discussed above. While small, any difference in input impedance causes less than perfect separation of CM and DM components when the CM and DM noise components are significantly different.

Figure 10:
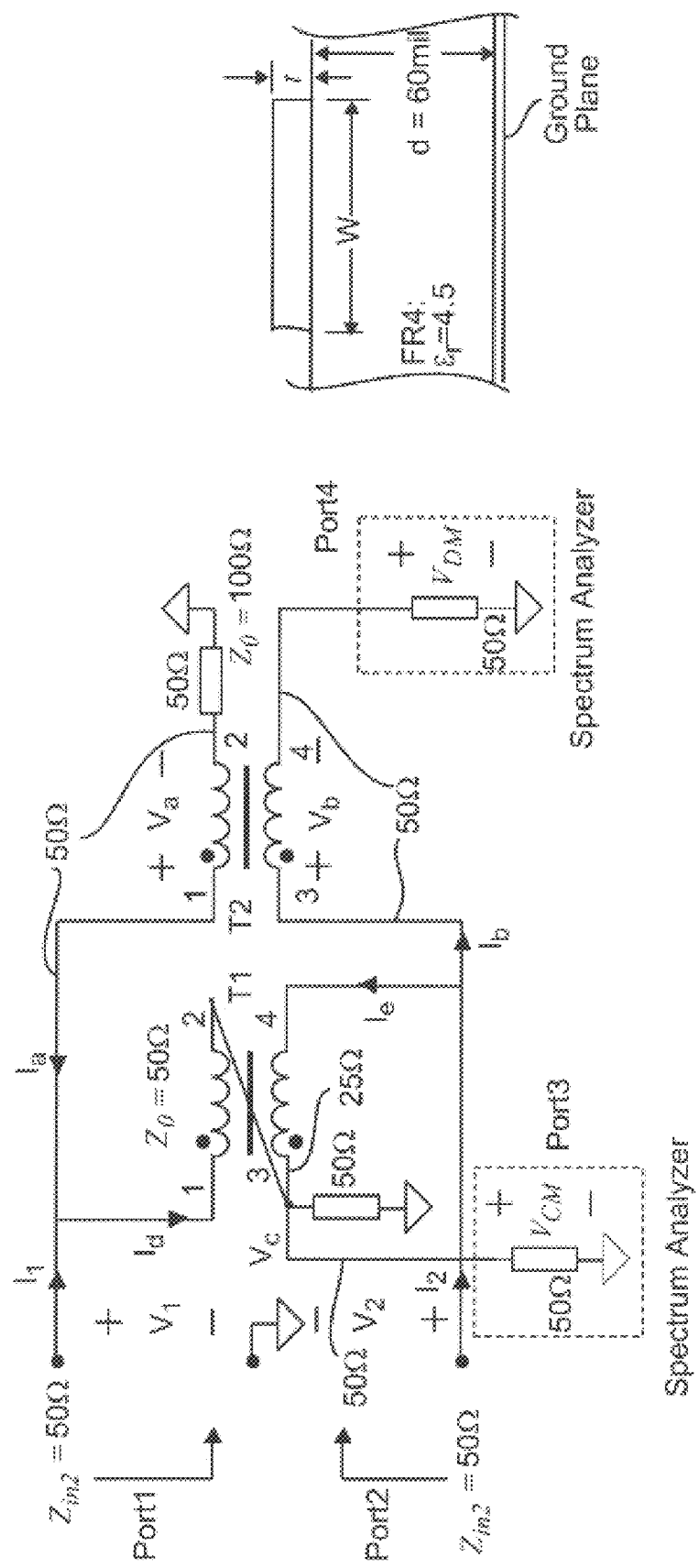
FIG. 10 is a schematic diagram of an improved noise separator circuit in accordance with the invention.

To achieve full symmetry, a preferred embodiment of the invention is schematically illustrated in FIG. 10 which differs from the circuit of FIG. 9 by moving the 50 Ohm terminating resistor from port 4 to the opposite winding of T2; maintaining the noise separation function while achieving circuit symmetry in regard to the input ports, port 1 and port 2. Thus the preferred embodiment of the invention illustrated in FIG. 10 yields good separation of the CM and DM noise components even when they differ by two order of magnitude or more.

While high performance has been achieved from a prototype in accordance with the basic principles of the invention and using the circuit of FIG. 2 or 9 and following good and established practices for prototype construction, higher levels of performance should theoretically be possible, even though real electrical components in any physical implementation of the invention cannot be ideal. For example, a short printed circuit board (PCB) trace should ideally have an impedance of zero, but, in fact, exhibits significant parasitic inductance and capacitance which cannot be ignored at frequencies above several megahertz and will degrade high frequency performance of the noise separator in accordance with the invention. Similarly, the leakage inductance between T1 and T2 exhibits a non-negligible impedance at high frequencies causing inaccuracy in measurement of CM and DM noise.

Accordingly, the inventors have performed an analysis of source of degradation of performance of the preferred embodiment of the invention illustrated schematically in FIG. 10 when physically implemented. These sources are 1.) The parasitic inductance and capacitance of PCB traces,
2.) The parasitic coupling of PCB traces,
3.) The leakage inductance between two windings of T1 and T2,
4.) The winding capacitance between two windings of T1 and T2,
5.) The mutual couplings between T1 and T2,
6.) The design of the magnetizing inductance of T1 and T2,
7.) Saturation of T1 and T2 at high noise,
8.) The impedance of the ground plane,
9.) The parasitic inductance of resistor pins, and
10.) The circuit layout of the noise separator. Thus, as perfecting features of the invention which are preferred but not necessary to the successful practice of the invention in accordance with its most basic principle several design principles for physically implementing the invention in regard to PCB design, coupled inductor design of T1 and T2, ground plane design, 50 Ohm resistor design, and circuit layout design will now be discussed with reference to FIGS. 11-18 in order to provide optimum performance and which address all of the above sources of performance degradation.

A. Printed Circuit Board Design

Figure 11:
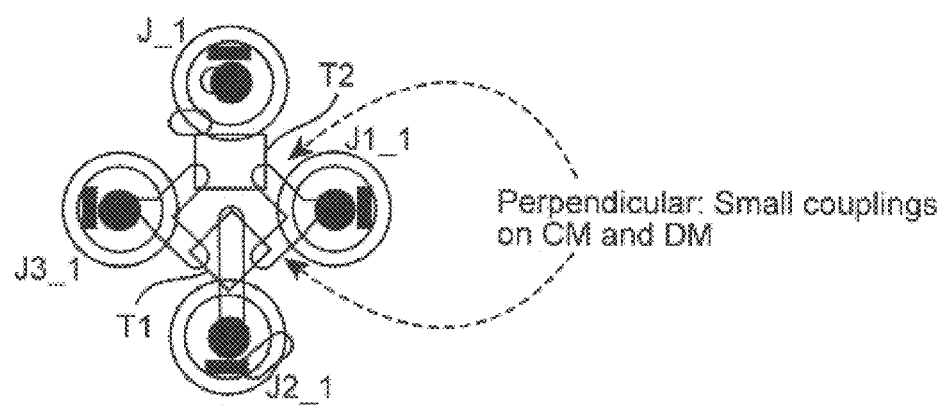
FIG. 11 illustrates a preferred layout of a preferred embodiment of the noise separator of FIG. 10.

First, in order to eliminate effects of parasitic inductance, the PCB traces should have a characteristic impedance of either 50 or 25 Ohms, depending on the impedance to which it is connected or impedances which it connects. Traces which should have a characteristic impedance of 50 ohms and 25 Ohms, respectively, are so labeled in FIG. 10. Corresponding PCB lead layout is illustrated in FIG. 11. The need for particular characteristic impedances is because PCB traces have parasitic capacitance between traces and the ground layer on the bottom of the PCB. This parasitic capacitance will conduct lead current to the ground. On the contrary, the parasitic inductance will cause lag current. Thus, when a certain relationship of the parasitic capacitance and the parasitic inductance is met, the two effects cancel each other, resulting in a so-called characteristic impedance, so that their adverse effects are eliminated.

Since the copper trace thickness, t, PCB substrate thickness, d, and permittivity, $\epsilon_r$, of the PCB substrate material (e.g. FR4) are all known, it is only necessary to design the width of the PCB traces to develop a capacitance which balances the parasitic inductance (each by unit length) obtain the desired characteristic impedance. For example, to obtain a characteristic of $Z_o$=50 Ohms for a trace it is first assumed that the trace width will be greater than twice the thickness of the PCB substrate (e.g. W/d>2 where W is the trace width and d is the substrate thickness) and a parameter, B, determined in accordance with microwave waveguide theory is used to calculate the trace width. If the trace width so computed is less than twice the PCB substrate thickness, contrary to the initial assumption, the process is repeated using a different parameter, A, also derived from microwave waveguide theory as in the following example:

$Z_0 = 50$

First guess: W/d>2

$$B = \frac{377\pi}{2X_a\sqrt{\varepsilon_r}} - 5.583$$

$$\frac{W}{d} = \frac{2}{\pi}\left[B - 1 - \ln(2B-1) + \frac{\varepsilon_r - 1}{2\varepsilon_r}\left\{\ln(B-1) + 0.39 - \frac{0.61}{\varepsilon_r}\right\}\right]$$
$$= 1.1917 < 2,$$

so the guess is wrong. W/d<2:

$$\Lambda = \frac{Z_0}{60}\sqrt{\frac{\varepsilon_r + 1}{2}} + \frac{\varepsilon_r - 1}{\varepsilon_r + 1}\left(0.23 + \frac{0.11}{\varepsilon_r}\right) = 1.544$$

$$\frac{W}{d} = \frac{8e^\Lambda}{e^{2\Lambda} - 2} = 1.8796 \Rightarrow W = 112 \text{ mil}$$

A similar process can be used to calculate a trace width yielding a $Z_0$=25 Ohm characteristic impedance.

Second, in order to minimize the capacitive and inductive coupling between traces, two adjacent traces should not be parallel to each other and, if possible, should be perpendicular to each other which results in minimal linking flux and opposed areas. A layout meeting such a condition is illustrated in FIG. 11.

B. Coupled Inductor Design for T1 and T2

There are several important issues in regard to design of T1 and T2. These are leakage inductance effects, mutual capacitance effects between T1 and T2, design of magnetizing inductance to guarantee low frequency performance and preventing saturation of T1 and T2 which will be discussed in order.

Figure 12:
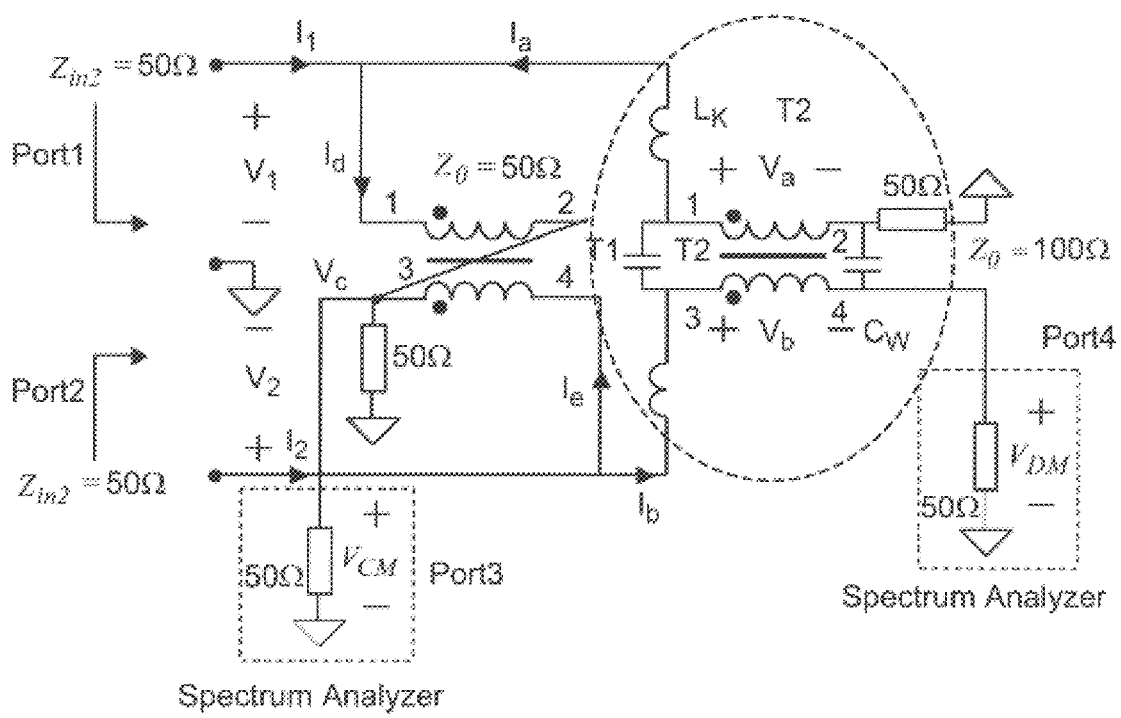
FIG. 12 illustrates effects of leakage inductance and winding capacitance in the circuit of FIG. 10.

First, two windings cannot be perfectly coupled; resulting in leakage inductance which has impedance that is proportional to frequency and changes the magnitude and phase of the measured noise. The winding capacitance between two windings has similar detrimental effects on performance. Referring now to FIG. 12, the circuit illustrated in FIG. 10 is redrawn to include leakage inductances Lk and interwinding parasitic capacitances Cw of coupled inductors/transformer T2. Similar inductances and capacitances also exist for coupled inductor/transformer T1 and have similar effects but are omitted from FIG. 12 for clarity.

When high frequency noise current flows through leakage inductance Lk, there is a leading voltage drop across Lk which results in a lagging current. At the same time, when the high frequency noise current flows through interwinding capacitance Cw, there is a leading current which is conducted by that capacitance.

Figure 13:
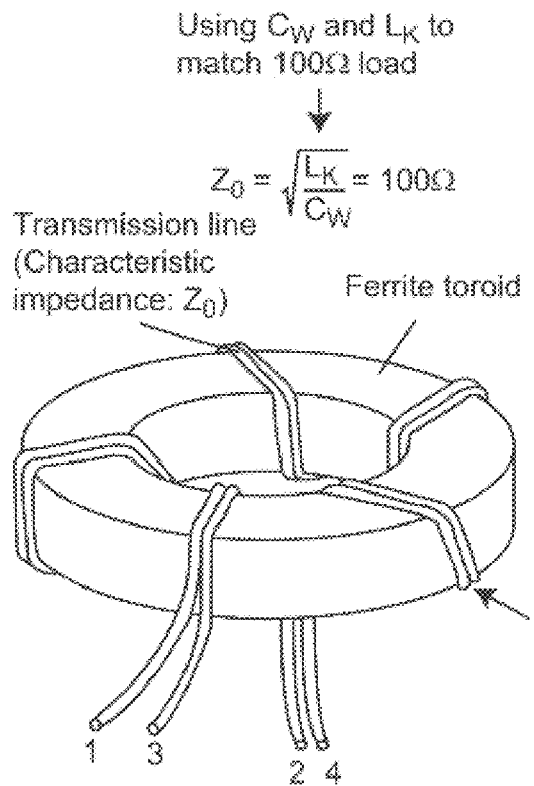
FIG. 13 illustrates using leakage inductance and winding capacitance to match a load.

The solution is therefore to cancel leakage inductance and winding capacitance effects by using transmission line transformers for T1 and T2. A transmission line transformer is formed by winding a transmission line having a characteristic impedance (achieved by balancing capacitive and inductive effects to achieve a substantially constant impedance over a wide frequency range, as discussed above) on a magnetic core. If the transmission line impedance is equal to the load impedance, there is no wave reflection on the load side. The transmission line thus has a flat response over the entirety of a wide frequency range and the effects of winding capacitance and leakage inductance can be canceled if the condition $$Z_0 = \sqrt{\frac{L_k}{C_w}} = 100 \, \Omega$$

is met. This can be accomplished because the winding capacitance and leakage inductance are actually distributed between the two windings and the two windings can be treated as a transmission line because they are on a magnetic core as illustrated in FIG. 13.

Figure 14:
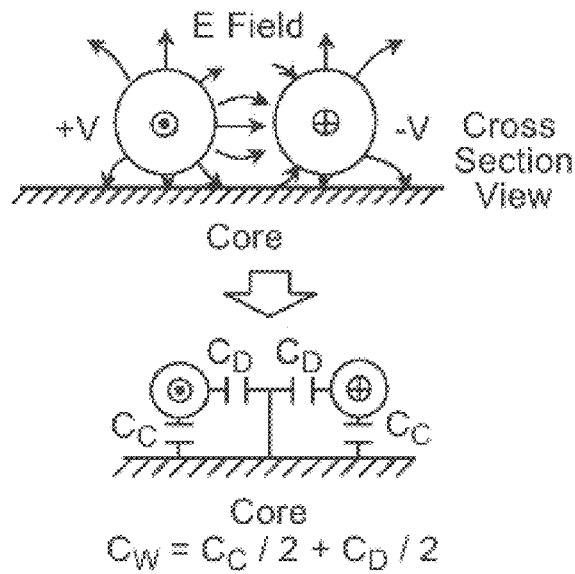
FIGS. 14 and 15 illustrate a preferred technique of modifying the characteristic impedance of windings.
Figure 15:
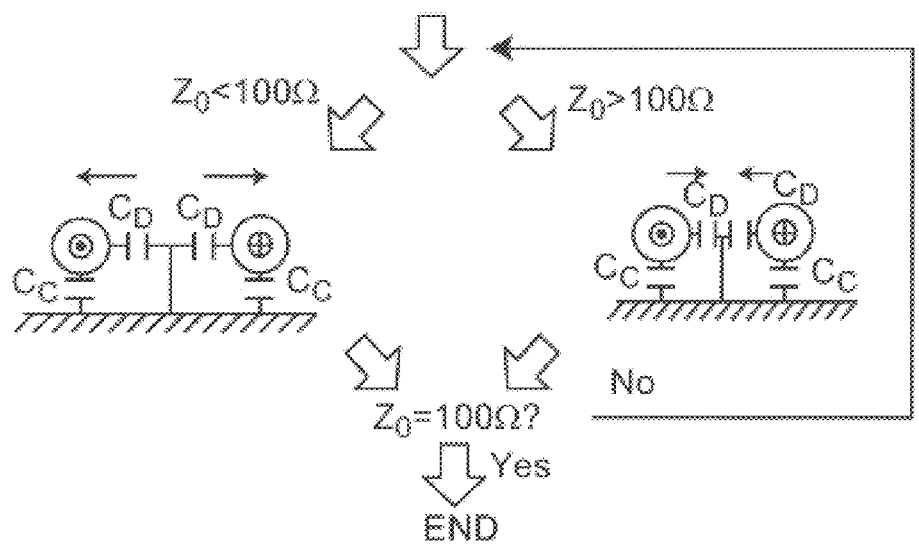
Figure 16:
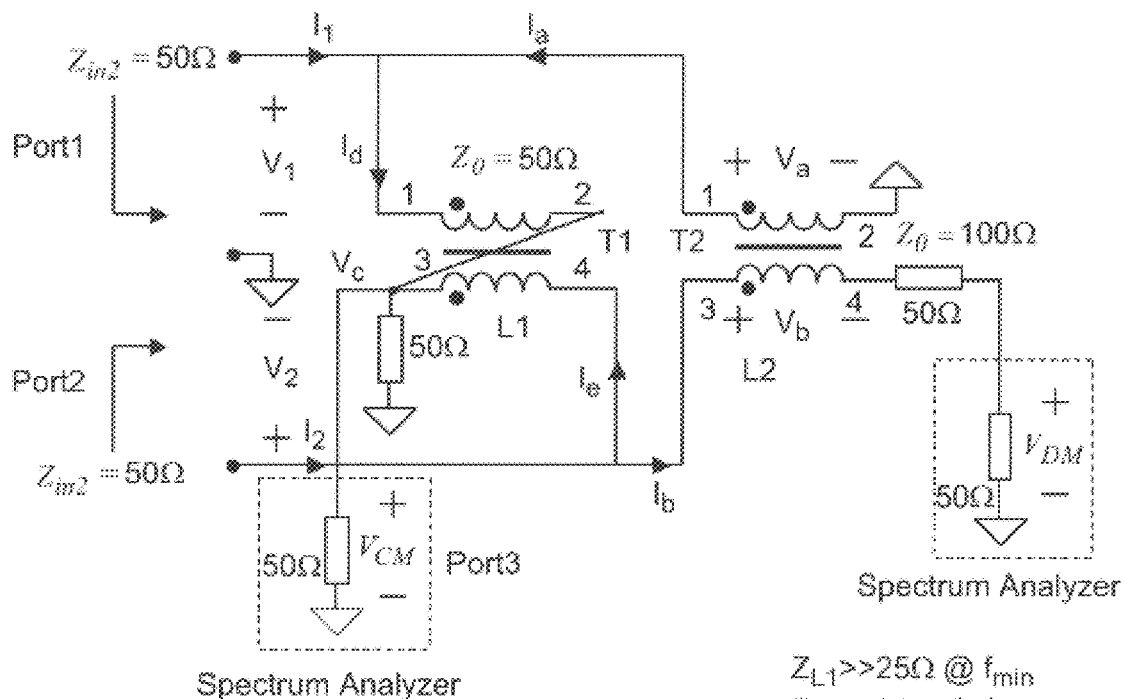
FIG. 16 illustrates design of the magnetizing inductance of the transformers in the circuit of FIG. 10, and FIGS. 17 and 18 illustrate a preferred ground plane and layout design for the circuit of FIG. 10.

To achieve a desired characteristic impedance of the transmission line formed by the windings, Lk and Cw can be adjusted, if necessary, to match a particular load impedance by the spacing of bifilar windings and proximity to the core as illustrated in FIGS. 14 and 15. FIG. 14 illustrates the nature of the electric field between two wires (shown in cross-section) having currents in opposite directions therein. The resulting parasitic capacitance $Cw = C_D/2 + C_D/2$ is also shown. As is well-understood, the values of $C_C$ and $C_D$ are dependent on the spacing of the conductors from the core and each other. The total parasitic winding capacitance Cw is thus equal to $C_C/2 + C_D/2$. There will also be magnetic fields surrounding each wire that are partially superimposed on each other and cause a magnetic flux (also partially superimposed) in the magnetic core on which they are wound. The corresponding leakage inductance, Lk, will generally vary with the spacing of the conductors from the core.

In general, Lk is very difficult to adjust, particularly with high accuracy, and it is therefore preferable to balance Lk by adjustment of the parasitic capacitance Cw. $C_C$ would typically be adjusted by changing the distance of the winding from the core which may be achieved through adjustment of insulation thickness of the winding or applying a spacer on the core over which the winding is wound. However, altering such spacing from the core will generally affect Lk and thus adjustment of $C_C$ introduces complexity and relatively high sensitivity into the process of balancing Lk (e.g. a decrease in $C_C$ will cause an increase in Lk) and is more difficult to adjust accurately than $C_D$ which can be achieved in a continuous manner and without alteration of transformer structure (e.g. applying a spacer or alteration of winding insulation thickness) by simply adjusting the position/separation of windings on the core.

While this relationship may be somewhat complex, the achievement of a desired characteristic impedance with sufficient accuracy to achieve improved performance of the noise separator in accordance with the invention by simply measuring the characteristic impedance and adjusting the spacing of the windings from each other and the core accordingly. The measurement can, itself, be simplified by determining the impedance in accordance with the equation:

$$Z_0 = \sqrt{\frac{L}{C}} = \sqrt{j\omega L \times \frac{1}{j\omega C}} = \sqrt{Z_{open} Z_{short}}$$

where directly measurable low frequency $Z_{open}$ is basically the impedance of Cw and directly measurable low frequency $Z_{short}$ is basically the impedance of Lk.

If the impedance is measured to be greater than that desired, the spacing between the conductors and/or the core is increased or, if the impedance is lower than desired, the spacing between the conductors and/or the core is reduced until an approximation of the desired characteristic impedance (e.g. Zo=100 Ohms since the load is two 50 Ohm resistors in series through the ground connection of each of ports 3 and 4) is achieved for cancellation of interwinding capacitance and leakage inductance in each of coupled inductor/transformers T1 and T2.

The leakage inductance of T1 and T2 exists even though its effects in each of coupled inductors/transformers T1 and T2 can be canceled. The leakage flux will extend into the vicinity of the windings and can cause mutual coupling between T1 and T2 and cause cross-talk between the separated CM and DM noise signals; reducing CMRR and DMRR. Therefore, it is desirable to separate T1 and T2 by as great a distance as possible and to orient the cores and windings to minimize mutual coupling. The layout illustrated in FIG. 16 has been found effective even though the overall noise separator device in accordance with the invention remains quite compact. In general, if the transformers are oriented to minimize coupling by insuring that the direction of the leakage flux of the respective transformers due to winding direction and position of windings on the core is between 45° (as illustrated in FIG. 11) and 90° to each other, a spacing between cores which is at least the size of the core(s) has been found to be sufficient to limit cross-talk to a very low level. Since there is necessarily a trade-off between layout size and coupling, once the transformer spacing is chosen, the actual relative orientation of the transformers is best achieved by rotation of the transformers to obtain optimal performance.

Also in regard to maintaining good CMRR and DMRR, the magnetizing impedance of T1 and T2 should be large enough to block a respective CM or DM noise mode, particularly at low frequencies. That is, the magnetizing inductance of T1 is used to block DM noise and should be large enough that most of the DM noise will flow through T2 and vice-versa. This criterion is particularly important for frequencies in the 10 KHz to 150 KHz range since the impedance in this frequency range is smaller than at higher frequencies. Thus the inductance of individual coils of T1 and T2 should have an impedance at the minimum frequency of interest which is much greater than 25 Ohms. A factor of thirty has been experimentally determined to be sufficient. Given that different EMI limit standards cover different frequency ranges, the inductance required will change with the minimum frequency of interest for that standard. For example, for standards EN55022, FCC 15, etc. directed to a frequency range of 150 KHz to 30 MHZ, an inductance equal to or greater that 796 µH is sufficient to maintain substantially complete separation of CM and DM signals whereas for standards MIL 461, DO 160, etc. directed to a frequency ranges of 10 KHz to 10 MHZ, an inductance equal to or greater than 11.94 mH is sufficient.

A final design consideration for T1 and T2 is the avoidance of saturation which will cause non-linear response and substantial error in the CM and DM signals. The magnitude of EMI noise is, of course, not initially known and high noise levels can potentially saturate the cores of the coupled inductors/transformers T1 and T2. To avoid saturation, the best solution is to provide accurate attenuators in the test, circuit of FIG. 6 prior to input port 1 and input port 2 of the noise separator. It is preferred to provide for connection of the attenuators to the noise separator with a switch. Thus, if the measurement with the attenuators connected is proportional to the measurement made without connection of the attenuators, it may be concluded that no saturation is occurring even without attenuation.

C. Ground Plane Design

It is important that an equipotential ground plane be provided to avoid susceptibility to radiated EMI sources other than the EUT being tested for conducted EMI noise and to keep all components of the noise separator in accordance with the invention at the same voltage reference at high frequencies. An equipotential ground plane is guaranteed anywhere in the noise separator in accordance with the invention by provision of multi-layer ground planes.

Figure 17:
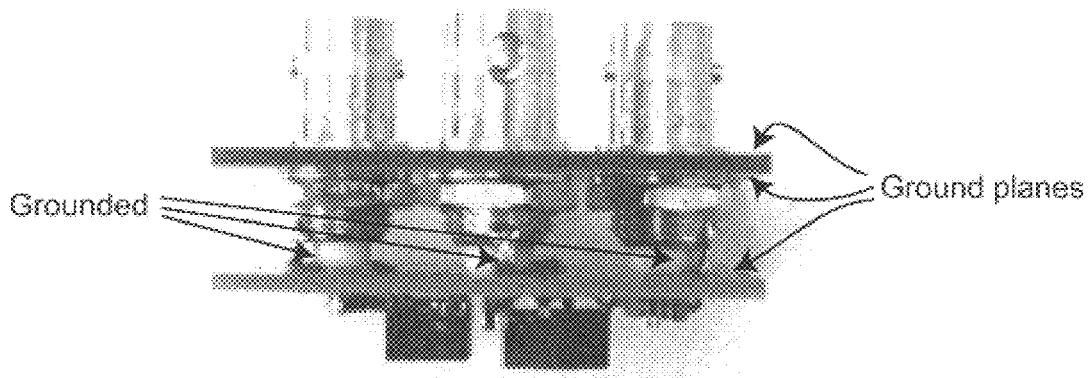

Specifically and as illustrated in FIG. 17, in order to keep equal ground potentials two double-clad (e.g. having copper or other conductive material on both sides) PCBs are used. One PBC is unpatterned on either side and preferably has four BNC or other style coaxial connectors forming port 1 through port 4 mounted thereon in a manner that is electrically connected to the conductive layer on both sides of the PCB. Since the bodies of the BNC connectors are grounded, both sides of this PCB serve as ground planes, for the other PCB, only one side is patterned and the BNC connectors are also soldered to the unpatterned side which thus also serves as a ground plane. The connection traces which are preferably sized to have characteristic impedances are formed on the patterned side of this PCB. the two 50 Ohm resistors and T2 can easily be ground to both the patterned and unpatterned sides of the PCB. Thus there are three ground layers in parallel which guarantees very low grounding impedance. the ground plane formed in this manner has almost perfect equipotential at all locations.

D. Resistor Design

The pins of the 50 Ohm resistors will necessarily exhibit parasitic inductance and thus should be kept as short as possible. The structure of FIG. 7 accommodates very short resistor lead since one lead can be soldered directly to the pins of the BNC connectors in an orientation that allows the connection of the other terminal to a PCB trace to be short, as well. These resistors are important in determining the input impedance to be 50 Ohms and precision resistors should be used.

The power rating of the resistors should be at least half the anticipated input noise power. Half of the input power is passed to the output ports and thus the remaining half of the input noise power must be dissipated by the resistors. Therefore, the power rating of the resistors should be greater than one-half the anticipated noise input power. However, precision resistors having larger power ratings generally have increased parasitic inductance or require somewhat longer leads doe to their size. Accordingly, it is preferable to choose a power rating somewhat less than the full anticipated input noise power. As a practical matter, since it is preferred to provide an attenuator as discussed above, the preferred design strategy is to choose a power rating for the resistors which is minimally (but with a safety margin) greater than the input noise power at which the onset of saturation of T1 and/or T2 is observed and to use the attenuator to reduce input power when necessary or during initial application of the input noise signal to prevent damage to the resistors if the noise power is unexpectedly large. In other words, since the noise separator in accordance with the invention cannot deliver accurate results if the inductors become saturated, it cannot be used for noise measurements at power levels above that which will cause such saturation. It therefore follows that, other than preventing damage to the resistors themselves (hence a safety factor alluded to above would be prudent), there is no justification for incurring increased parasitic inductance due to choice of resistor power level above that which causes inductor saturation.

E. Circuit Layout Design

Figure 18:
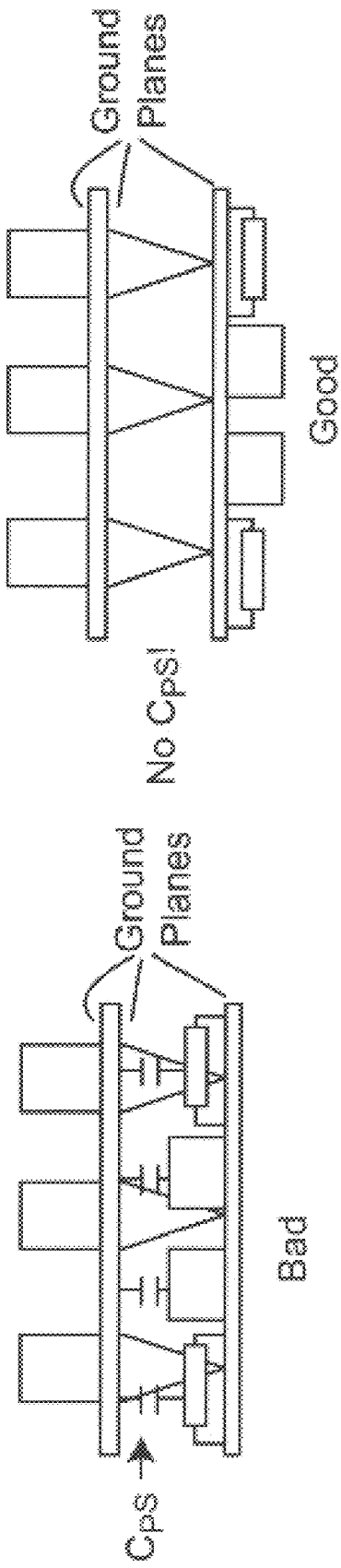

The principal concern of circuit layout design is to limit parasitic capacitance of resistors and inductor/transformers. Such parasitic capacitance can conduct noise current at high frequencies and degrade performance of the noise separator. Minimization of such parasitic capacitance can be accomplished by the simple expedient of mounting the resistors and inductors/transformers outside rather than between the layer forming the ground plane to prevent capacitance to those layers and using the layer most proximate to those components as a shield as illustrated in FIG. 18. In this regard, if the components are located in an opposite configuration between the connectors, compactness of the assembly would be compromised with consequent possible increase of parasitic inductance due to longer connections or parasitic capacitance to other structures as well as possible interference with making connections of cables to the BNC connectors. Therefore the configuration shown in FIG. 18 is much preferred.

In view of the foregoing, it is clearly seen that the invention provide for accurate separation and concurrent independent measurement of CM and DM noise components of conducted EMI noise. The noise separator employing the most basic principles of the invention exhibits far more accurate results than have been heretofore attained and additional perfecting features of design of the circuit symmetry with respect to the inputs, the PCB design, the design of inductors/transformers T1 and T2, ground plane design, resistor design and/or circuit layout design allows substantially ideal performance to be closely approached.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A circuit for separating common mode (CM) and differential mode (DM) components of conducted electromagnetic interference (EMI) noise, said circuit comprising
   a pair of input ports,
   a pair of coupled inductors forming a transformer each coupled inductor of said pair of coupled inductors having one terminal connected to a respective one of said input ports, said coupled inductors being coupled to subtractively superimpose currents therein whereby a second terminal of one of said pair of coupled inductors outputs a fraction of said differential mode noise,
   a pair of series-connected coupled inductors forming a transformer each inductor of said pair of series connected coupled inductors having one terminal connected to a respective one of said input ports, said series connected coupled inductors being coupled to additively superimpose currents therein whereby a fraction of common mode noise is output from a node serially connecting said pair of series connected coupled inductors, and impedance matching resistors connected such that said circuit for separating common mode and differential mode components of conducted EMI noise is symmetrical with respect to respective input ports of said pair of input ports.

2. A circuit as recited in claim 1, further including connections from said pair of input ports to said transformers and from said transformers to said pair of output ports wherein said connections have characteristic impedances.

3. A circuit as recited in claim 1, further including connections from said pair of input ports to said transformers and from said transformers to said pair of output ports wherein some of said connections are formed in a direction perpendicular to others of said connections.

4. A circuit as recited in claim 1, wherein said pairs of coupled inductors are transmission line transformers.

5. A circuit as recited in claim 1, wherein said pairs of inductors have a characteristic impedance matched to a load by adjustment of spacing between conductors forming a winding on a core.

6. A circuit as recited in claim 1, wherein said pairs of inductors have a magnetizing inductance providing an impedance of at least thirty times the impedance of a load connected thereto at the minimum frequency of interest.

7. A circuit as recited in claim 1, further including a printed circuit board having unpatterned conductive material on a side thereof opposite to a side including connections formed of patterned conductive material, said connections and facing a further printed circuit board having unpatterned conductive material on both sided thereof to provide three ground planes.

8. A circuit as recited in claim 1, wherein said pairs of coupled inductors and said matching impedances are mounted on a side of a printed circuit board providing connections such that unpatterned conductive material shields said coupled inductors and said matching resistors from ground planes on a further printed circuit board whereby parasitic capacitance to conductive material on said further printed circuit board is avoided.

9. A circuit as recited in claim 1, wherein said pairs of coupled inductors are mounted such that leakage flux of one pair of coupled inductors is at an angle of 45° to 90° to leakage flux of another pair of said coupled inductors.

10. A circuit as recited in claim 1, wherein said pairs of couple inductors are spaced from each other by a distance equal to or larger than a core of either pair of coupled inductors.

11. A circuit as recited in claim 1 further including a pair of attenuators connectable to said first and second ports.

12. A circuit as recited in claim 1, further including a pair of output ports for concurrently outputting CM and DM components of EMI noise respectively.

13. A circuit as recited in claim 12, further including a printed circuit board providing connections from said pair of input ports to said transformers and from said transformers to said pair of output ports.

14. A circuit as recited in claim 13, wherein said connections on said printed circuit board are formed to have characteristic impedances.

15. A circuit as recited in claim 14, wherein some of said connections are formed in a direction perpendicular to others of said connections.

16. A circuit as recited in claim 15, wherein said pairs of coupled inductors are transmission line transformers.

17. A circuit as recited in claim 16, wherein said transmission line transformers have a characteristic impedance of 100 Ohms.

18. A circuit as recited in claim 17, wherein said characteristic impedance is achieved by adjustment of spacing between conductors of a transmission line wound on a core.

19. A circuit as recited in claim 18, wherein said transformers have a magnetizing inductance providing an impedance of at least thirty times the impedance of a load connected thereto at the minimum frequency of interest.

20. A circuit as recited in claim 19, wherein said printed circuit board has unpatterned conductive material on a side thereof opposite to said connections and facing a further printed circuit board having unpatterned conductive material on both sided thereof to provide three ground planes.

21. A circuit as recited in claim 20, wherein said transformers and said matching impedances are mounted on a side of said printed circuit board providing said connections such that said unpatterned conductive material shields said transformers and said matching resistors from ground planes on said further printed circuit board whereby parasitic capacitance to conductive material on said further printed circuit board is avoided.

22. A circuit as recited in claim 21, wherein said transformers are mounted on said printed circuit board such that leakage flux of one transformer is at an angle of 45° to 90° to leakage flux of another transformer.

23. A circuit as recited in claim 22, wherein said transformers are spaced from each other by a distance equal to or larger than a core of either transformer.

* * * * *